United States Patent [19]
Tadros

[11] Patent Number: 4,597,828
[45] Date of Patent: Jul. 1, 1986

[54] METHOD OF MANUFACTURING PRINTED CIRCUIT BOARDS

[75] Inventor: Jehane Tadros, Mississauga, Canada

[73] Assignee: Firan Corporation, Oakville, Canada

[21] Appl. No.: 715,618

[22] Filed: Mar. 25, 1985

[51] Int. Cl.[4] .................. B44C 1/22; C03C 15/00; C23F 1/02; B29C 17/08

[52] U.S. Cl. .................. 156/643; 156/646; 156/655; 156/656; 156/668; 156/902; 204/192 EC; 204/192 E; 427/96

[58] Field of Search .............. 156/643, 646, 655, 656, 156/668, 902; 427/38, 39, 96-98; 204/192 EC, 192 E, 15, 20, 22, 23, 27, 38 B, 38 S

[56] References Cited

U.S. PATENT DOCUMENTS

| | | | |
|---|---|---|---|
| 4,351,697 | 9/1982 | Shanefield et al. | 156/901 X |
| 4,389,268 | 6/1983 | Oshima et al. | 156/902 X |
| 4,424,095 | 1/1984 | Frisch et al. | 156/629 |
| 4,536,271 | 8/1985 | Collins | 156/643 X |

Primary Examiner—William A. Powell
Attorney, Agent, or Firm—Ridout & Maybee

[57] ABSTRACT

In order to enable fine traces to be obtained on printed circuit boards without excessive undercutting, while maintaining a high degree of adhesion, an unclad FRA board is provided with a surface butter coat which is etched to form a microporous surface layer. This layer is subjected to treatment in a plasma additively reactive with surface groups of the butter coat resin to provide modified groups promoting adherence to a thin metallization layer of vacuum deposited copper. The metallization layer is selectively electroplated to form the desired circuit pattern, and the unplated areas of the metallization layer are etched away.

14 Claims, No Drawings

METHOD OF MANUFACTURING PRINTED CIRCUIT BOARDS

This invention relates to the preparation of printed circuit boards.

In recent years, developments in electronics have required boards having copper traces of increasingly narrower width and closer spacing. When utilizing conventional etching techniques to prepare such boards from laminates, typically of copper upon a glass fibre reinforced epoxy substrate, undercutting of the copper layer during etching becomes a problem which limits the degree to which trace width can be reduced without violating the minimum acceptable design line width required for the application. This problem has directed attention to alternative techniques in which a thin surface metallization is applied to an unclad substrate, and the thin metallic layer so produced is then built up to a required thickness in areas where conductors are required. With such a process, only the thin metallic layer needs to be etched away in the areas where no conductor is required, and undercutting ceases to be a problem. Unfortunately, it has proved difficult with known metallization techniques to provide a metallic layer of sufficient adherence to the substrate to meet the specifications commonly required for high quality boards, in particular military specifications which commonly require a very high degree of adherence (typically a minimum of 8 lbs. per inch Pull Test).

Known techniques have been employed to promote adherence of metallization layers to synthetic resin substrates, conventional practice involving etching of the resin surface using a suitable usually strongly acid and oxidizing etchant so as to provide a hydrophilic and microporous surface which promotes adhesion of subsequently applied material. It has also been proposed to utilize electrical discharge treatments either prior to or contemporaneously with the initial stages of metal deposition by vacuum metallization or sputtering. Where such techniques have been utilized in the manufacture of printed circuit boards, it has commonly been in conjunction with the use of electroless plating techniques which, whilst valuable in plating through holes drilled in circuit boards, are quite expensive and must be supplemented by additional plating steps for the formation of the relatively heavy metal deposits required for printed circuit board conductors.

According to the invention, a method of preparing a printed circuit board comprises etching the external surface of a synthetic resin substrate board without metal cladding to provide a microporous structure in surface layers of the board which are free of fibrous reinforcement, freeing said surface layers of etchant residues, subjecting said surface to a plasma treatment in a plasma additively reactive with surface groups of the resin to provide modified surface groups promoting adherence to a metallization layer, metallizing the plasma treated surfaces by vacuum deposition or sputtering to provide a thin layer of copper, selectively electroplating the copper layer with a much thicker layer of copper in accordance with a desired circuit pattern, and etching away unplated areas of the metallization layer.

Further features of the invention and preferred implementations of the various steps set forth above will be disclosed further in the following description of preferred embodiments of the invention.

Although the invention is not restricted to such boards, it finds its primary utility in the production of printed circuits formed on fibre reinforced (usually glass fibre reinforced) epoxy resin substrates. Conventionally, the starting material for such boards is a multilayer laminate of resin impregnated reinforcing material, clad on one or both sides during manufacture with copper foil. During curing, the epoxy resin forms an excellent bond to the copper. It is normally desirable, and military specifications require, the use of a fire retardant resin, and most applications use laminates of the type known as FR4 and complying with military specification MIL-P-13949-4.

For reasons set forth above, difficulties arise in the use of pre-clad boards where very fine or narrowly spaced circuit traces are required. Whilst unclad boards without the copper layers are available under the name G10-FRA and complying with military specification MIL-P-18177C, it is difficult to obtain sufficient adherence of subsequently deposited metal layers since the epoxy resin is already cured and its bonding properties are thus unavailable. Severe surface treatments of G10-FRA boards in efforts to promote adherence run the risk of exposing the reinforcement of the outer layer, which is usually unacceptable. I therefore utilize a board to which an additional surface "butter" coat of epoxy resin, free from fibre reinforcement, has been applied. In conventional laminates, the minimum thickness of the surface layer of resin over the fibre reinforcement may be no more than about 12 microns, and preferably the butter coat increases this minimum to about 50 microns. The butter coat may be of similar resin to that used in the rest of the laminate, or modified as discussed further below.

The butter coat is subjected to an etching process to render its surface layers microporous. Because of the resistance of epoxy resins to available etchants, I have found that adequate etching of the surface layers in a reasonable time requires pretreatment of the surface layers to increase their susceptability to the etchant. One form of pretreatment involves exposing the surfaces of the board to a swelling agent known to be effective on epoxy resins. I have obtained good results using a bath of ethylene glycol monomethyl ether for 30–60 minutes at 40–60° C. An alternative form of pretreatment involves loading the resin of the butter coat with a second phase which will be attacked by the etchant to promote the formation of pores in the surface layers. The second phase should of course be compatible with the pore size desired and should not migrate away from the surface of the resin during curing. I have obtained good results using granules of nitrile rubber (grade 1453 or 1442 from B. F. Goodrich) dissolved in methyl ethyl ketone and mixed in with the butter coat resin application prior to curing, to provide a coating containing 23% by weight solids, 11.5% by weight being rubber, which coating was cured at 155° C. for 2.5 hours.

The etchant used may again be conventional. Where I use a swellant, I find that treatment with a conventional etching mixture of chromic and sulphuric acids (920 g/l $H_2SO_4$, 60 g/l $CrO_3$) for a period of 17–20 minutes at 50° C. gives an approximately five micron pore size. Where the butter coat is loaded, and no swellant is used, I find that generally similar results can be obtained using a solution of potassium dichromate (30 g/l) in sulphuric acid (644 g/l) and orthophosphoric acid (5 g/l) for 10–30 minutes at 32°–50° C. It will of course be understood that all these figures are exemplary only.

I have found that it is very important if good adhesion of the conductive layer is to be obtained in the finished product that the board is thoroughly cleaned to remove traces of etchant: a rinse in isopropyl alcohol followed by 30 minute boiling in de-ionized water provides good results.

At this point the board may conveniently be drilled with any desired holes. Earlier drilling may be undesirable in that it exposes the reinforcement to the etchant.

Whilst the etching process described above would on its own significantly improve the adherence of a subsequently applied metallization layer because of the "keying" effect of the microporous structure of the surface layer, I find that it is on its own usually insufficient to meet military specifications for adherence of the traces in a finished circuit board. I therefore seek to restore the bonding capability of the original uncured resin by subjecting the surface layers to a plasma treatment to modify surface groups of the resin and restore their capability of forming a chemical bond with subsequently deposited layers. Several methods are described below for achieving this objective, but should not be regarded as exhaustive.

Firstly, the etched boards may be placed in a treatment chamber and subjected to plasma formed by radio frequency or microwave excitation of low pressure ammonia, or a mixture of nitrogen and hydrogen, the effect of the treatment being believed to be the implantation of amino groups on the surface of the resin which promote its ability to bond to superposed metallic layers. This type of treatment has the advantage that no reaction products are formed which may result in unwanted deposits in the plasma treatment chamber. Typical operating parameters are: frequency 13.56 MHz; RF power up to 3.5 kW; gas pressure 0.2–0.4 torr, and treatment time 5–20 minutes.

Secondly, the ammonia gas may be replaced by diamino propane or another gaseous amino compound. The plasma treatment results in polymerization of the diamino propane which grafts a polymer film to the surface of the resin, again provided with amino groups on its surface to promote subsequent bonding of a metallization layer. Whilst this technique when tested with microwave excitation of the plasma provided good results, deposits accumulate in the reaction chamber which require to be removed from time to time.

In a third technique, the boards are subjected to a direct current excited low pressure oxygen plasma utilizing a copper cathode in a technique similar to sputtering except for using an oxidizing rather than an inert gas to form the plasma. The oxygen and copper react with the resin surface to introduce groups which form an excellent bond to a thin film of chromium evaporated thereon, which film can then be followed by deposition of a copper layer as described further below.

The drilled and plasma treated boards are then placed in a vacuum deposition chamber and a layer of copper is deposited thereon using conventional vacuum metallization techniques. The thickness of this layer should be only sufficient to permit subsequent handling and electroplating, and a layer thickness of about 1 micron will usually be satisfactory. It should however be noted that the storage life of a board in this condition will be limited because of oxidation.

At this point the board is laminated with a photoresist layer, and the photoresist layer is exposed and developed to provide a desired conductor pattern in accordance with conventional printed circuit board techniques, except that the resist layer remains after development in the areas where conductors are not required in the finished product. The areas of the copper exposed after development of the resist are then electrolytically plated to develop the full thickness of copper required in the finished board. The remaining resist is stripped, and the board is subjected to a light etch, in a conventional copper etchant, so as to remove the thin layer of vacuum deposited copper from the areas where conductors are not required. This etching will have a minimal effect on the much thicker electrolytically deposited copper applied during the plating step.

The board may then be subjected to conventional finishing processes such as the application of a tin lead coating to the copper and of solder masks, but these finishing steps should desirably include an annealing process at elevated temperature to relieve stresses set up in the board during processing.

The invention is further illustrated by the following example.

EXAMPLE

An unclad butter coated glass epoxy resin board (Norplex (trade mark), G10-FRA, 4"×4"×0.060") was cleaned in a 5% solution in water of a neutral detergent (Enplate (trade mark) from Enthone), and rinsed for 5 minutes in running cold water. The surfaces of the board were then swelled in ethylene glycol monomethyl ether at 40° C. for 30 minutes, followed by rinsing for 5 minutes in running cold water, and etched in $CrO_3/H_2SO_4$ solution ($CrO_3$, 60 g/l; $H_2SO_4$, 920 g/l) for 17 minutes at 50° C. The board was rinsed for 5 minutes in running cold water, soaked for 45 seconds in a 2% NaOH solution at 15° C., and rinsed again for 5 minutes in running cold water.

It was next wiped and rinsed with isopropyl alcohol, soaked for 30 minutes in boiling de-ionized water, sprayed with de-ionized water for 30 seconds at 20° C., and air dried.

Immediately before plasma treatment, the board was dried for 10 minutes at 140° C., and then treated in an ammonia plasma at 0.25 torr for 11 minutes, the plasma being R.F. energized at 13.56 MHz using a power of 1500 W. The treated board was wrapped in oxygen plasma cleaned aluminum foil awaiting metallization.

In the metallization step, the board was vacuum metallized with a 1 micron thickness of copper. The copper was then plated in a copper sulphate plating bath ($Cu^{+2}$, 2.9 oz/gal; $H_2SO_4$, 25.0 oz/gal; $Cl^-$, 50–70 ppm; Cu gleam, 0.4 volume %) at 20 A/ft$^2$ for 60 minutes to a thickness of 36 microns. After rinsing for 5 minutes in running cold water, the board was annealed for 1 hour at 150° C.

The peel strength measured was 8.8 lb/in (average of 6 readings). Boards similarly prepared up to and including the metallization step were laminated with a resist coating, followed by exposure development of the resist as described above prior to plating. When the remaining resist was removed, and the unplated areas of the metallization etched away by brief exposure to a conventional ferric chloride based etchant solution, it was found that the plated areas were free of undercutting.

I claim:

1. A method of preparing a printed circuit board comprising etching the external surface of a synthetic resin substrate board without metal cladding to provide a microporous structure in surface layers of the board which are free of fibrous reinforcement, freeing said surface layers of etchant residues, subjecting said surface to a plasma treatment in a plasma additively reactive with surface groups of the resin to provide modified surface groups promoting adherence to a metallization layer, metallizing the plasma treated surfaces by vacuum deposition or sputtering to provide a thin layer of copper, selectively electroplating the copper layer with a much thicker layer of copper in accordance with a desired circuit pattern, and etching away unplated areas of the metallization layer.

2. A method according to claim 1, wherein the synthetic resin is an epoxy resin.

3. A method according to claim 2, wherein the board is a fibre reinforced laminate having a surface butter coat free of fibrous reinforcement.

4. A method according to claim 3, wherein the surface layers of the board are provided with said hydrophilic microporous structure by etching.

5. A method according to claim 4, wherein the surface layers are modified to improve their susceptibility to etching.

6. A method according to claim 5, wherein the surface layers are modified by incorporating a filler in the butter coat having an increased susceptibility to the etchant used.

7. A method according to claim 5, wherein the surface layers are treated with a swellant prior to etching.

8. A process according to claim 3, wherein the plasma used in the plasma treatment is an ammonia plasma.

9. A process according to claim 3, wherein the plasma used in the plasma treatment is a nitrogen and hydrogen plasma.

10. A process according to claim 3, wherein the plasma used in the plasma treatment is a diamino propane plasma.

11. A process according to claim 3, wherein the plasma used in the plasma treatment is oxgen plasma excited by direct current using a copper cathode.

12. A process according to claim 11, wherein a thin film of chromium is applied prior to the metallization layer.

13. A process according to claim 1, wherein the finished board is subjected to an annealing heat treatment to relieve stresses therein.

14. A process according to claim 1, wherein the etching treatment is such as to provide a pore size of about 5 microns in the microporous surface layers.

* * * * *